(12) United States Patent
Lee

(10) Patent No.: US 6,462,475 B1
(45) Date of Patent: Oct. 8, 2002

(54) POWER SAVING ENVIRONMENT PROTECTION BULB

(76) Inventor: Han-Ming Lee, P.O. Box 7-820, Taipei (TW)

( * ) Notice: Subject to any disclaimer, the term of this patent is extended or adjusted under 35 U.S.C. 154(b) by 0 days.

(21) Appl. No.: 09/867,778

(22) Filed: May 31, 2001

(51) Int. Cl.⁷ .................................................. H01J 7/44
(52) U.S. Cl. .......................................... 315/57; 315/70
(58) Field of Search .............................. 315/56, 57, 70, 315/85, 178, 182, 183, 185 R, 189, 326; 362/226, 234, 249, 433

(56) References Cited

U.S. PATENT DOCUMENTS 5,189,339 A * 2/1993 Peshak .......................... 315/58
5,545,950 A * 8/1996 Cho .............................. 315/56

* cited by examiner

Primary Examiner—Don Wong
Assistant Examiner—Thuy Vinh Tran

(57) ABSTRACT

A power saving environment protection bulb comprises a cover disk having a plurality of ring portions formed therein; at a lower sides of the holes near the bottom of the cover disk being installed with tapered tracks; edges of the bottom of the cover disk being installed with tenons which are spaced with an equal distance; a circuit disk having holes for positive and negative electrodes; a middle section of the end piece having two lateral plates arranged continuously; each plate having a protrusion for sealing a taper groove on the cover disk, upper ends of the plates being formed with a sleeve which is conformable to the hole of the cover disk; a transformer plate having one side installed with two inserting tubes; a lamp seat being a plastic casing; a casing of the seat being combined with a copper cap; an inner side of the casing being formed with buckling grooves, which are arranged with equal space.

3 Claims, 7 Drawing Sheets

POWER SAVING ENVIRONMENT PROTECTION BULB

FIELD OF THE INVENTION

The present invention relates to a power saving environment protection bulb, which can be assembled according to the requirement of the environment and has multiple functions.

BACKGROUND OF THE INVENTION

The prior art bubbles have glass casings with tungsten silks therein for illumination. In general, these prior art design consumes large powers. Moreover, a great deal of heat is emitted so as to hurt the hand of the user, especially, children. Furthermore, if the bubble is cracked, then the cracked pieces will become a large burden to the environment. Although fluorescent lamps are used to substitute the conventional bubble for consuming less power, however, the aforesaid defect still exists.

SUMMARY OF THE INVENTION

Accordingly, the primary object of the present invention is to provide a power saving environment protection bulb comprises a cover disk having a plurality of ring portions formed therein; at a lower sides of the holes near the bottom of the cover disk being installed with tapered tracks; edges of the bottom of the cover disk being installed with tenons which are spaced with an equal distance; a circuit disk having holes for positive and negative electrodes; a middle section of the end piece having two lateral plates arranged continuously; each plate having a protrusion for sealing a taper groove on the cover disk, upper ends of the plates being formed with a sleeve which is conformable to the hole of the cover disk; a transformer plate having one side installed with two inserting tubes; a lamp seat being a plastic casing; a casing of the seat being combined with a copper cap; an inner side of the casing being formed with buckling grooves; which are arranged with equal space.

DETAILED DESCRIPTION OF THE PREFERRED EMBODIMENTS

Figure 1:
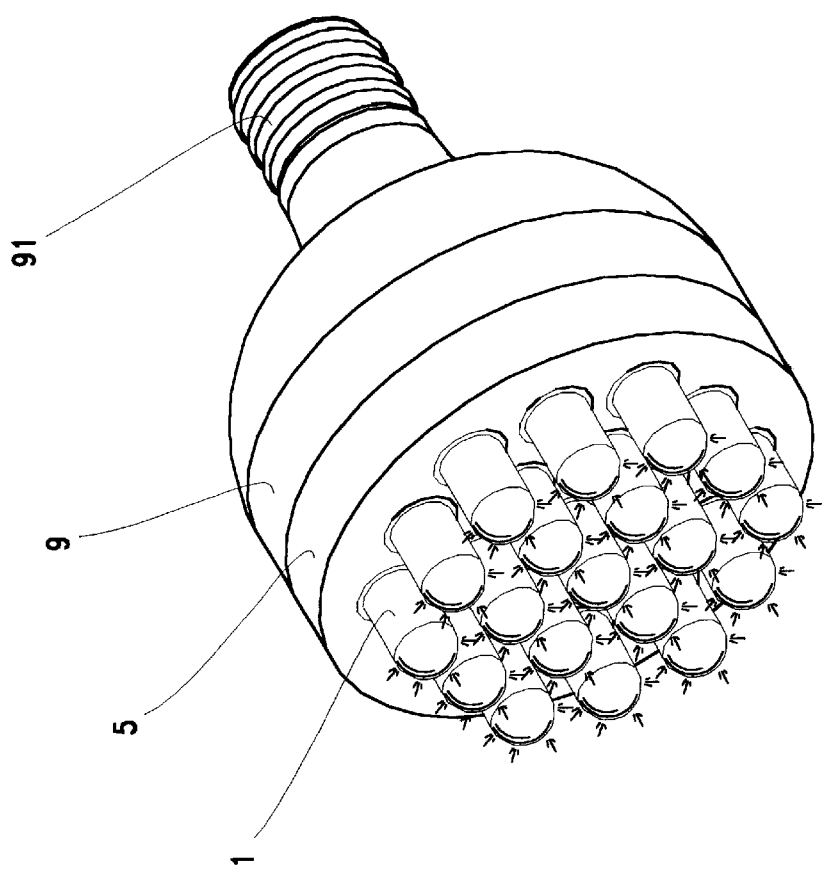
FIG. 1 is a schematic view of the structure of the present invention.
Figure 2:
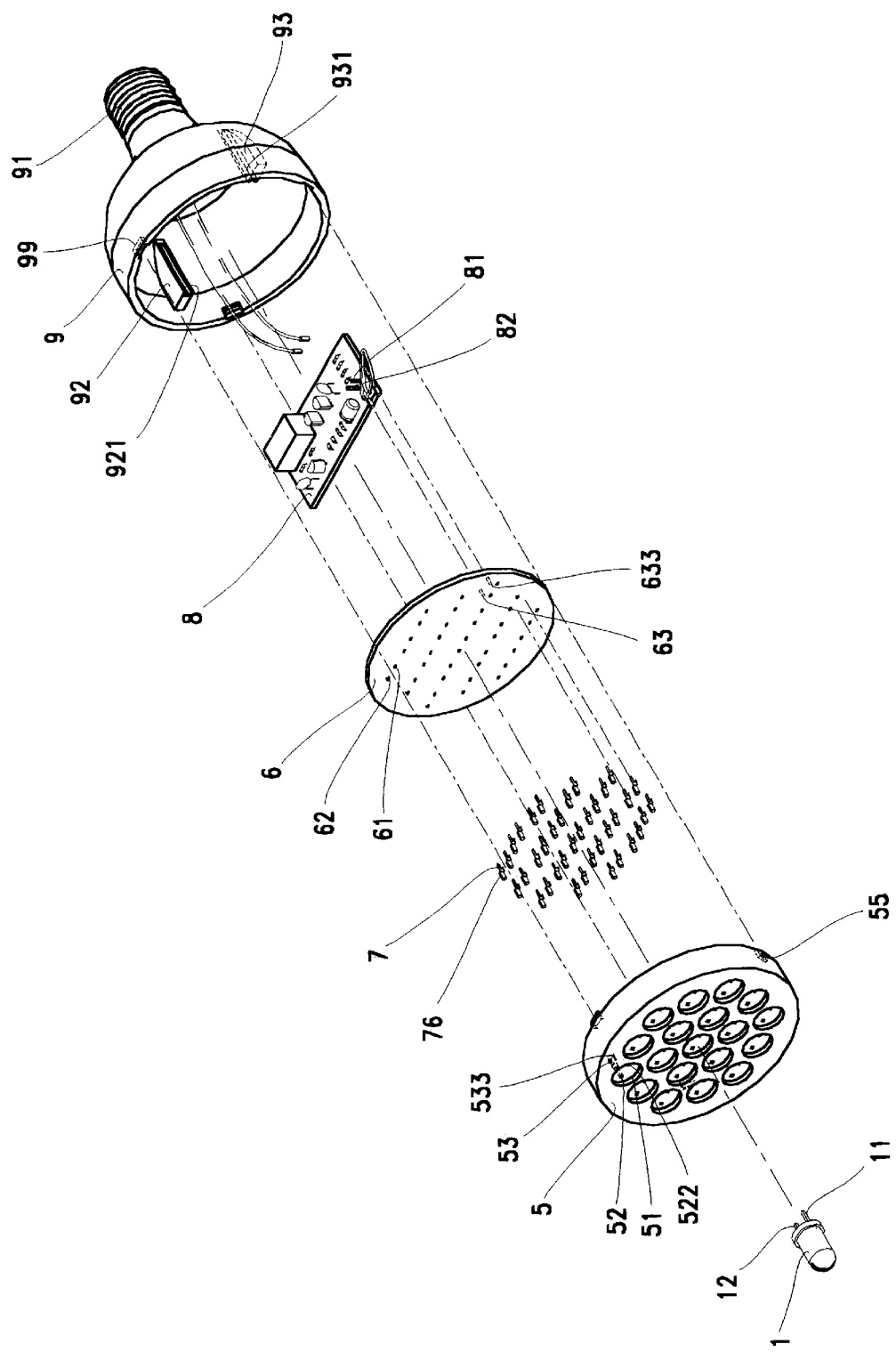
FIG. 2 is a perspective view showing the components of the present invention.
Figure 3:
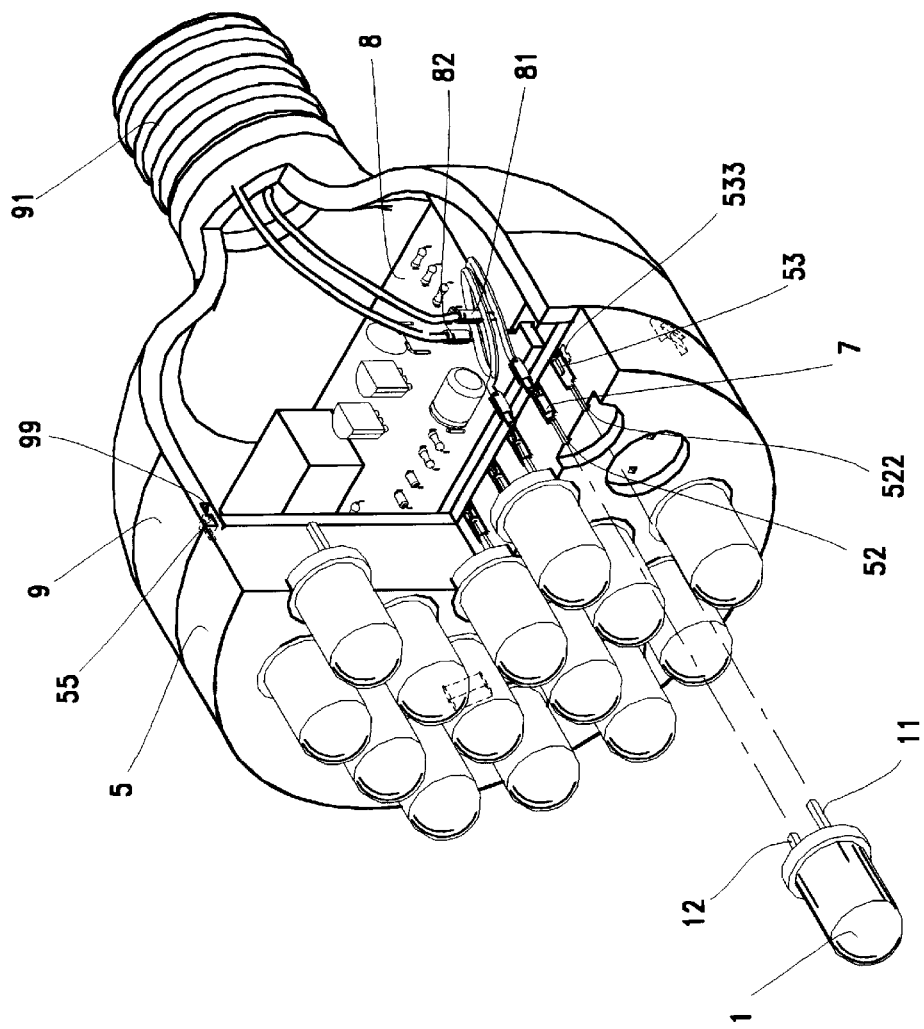
FIG. 3 is a cross sectional view of the present invention.
Figure 4:
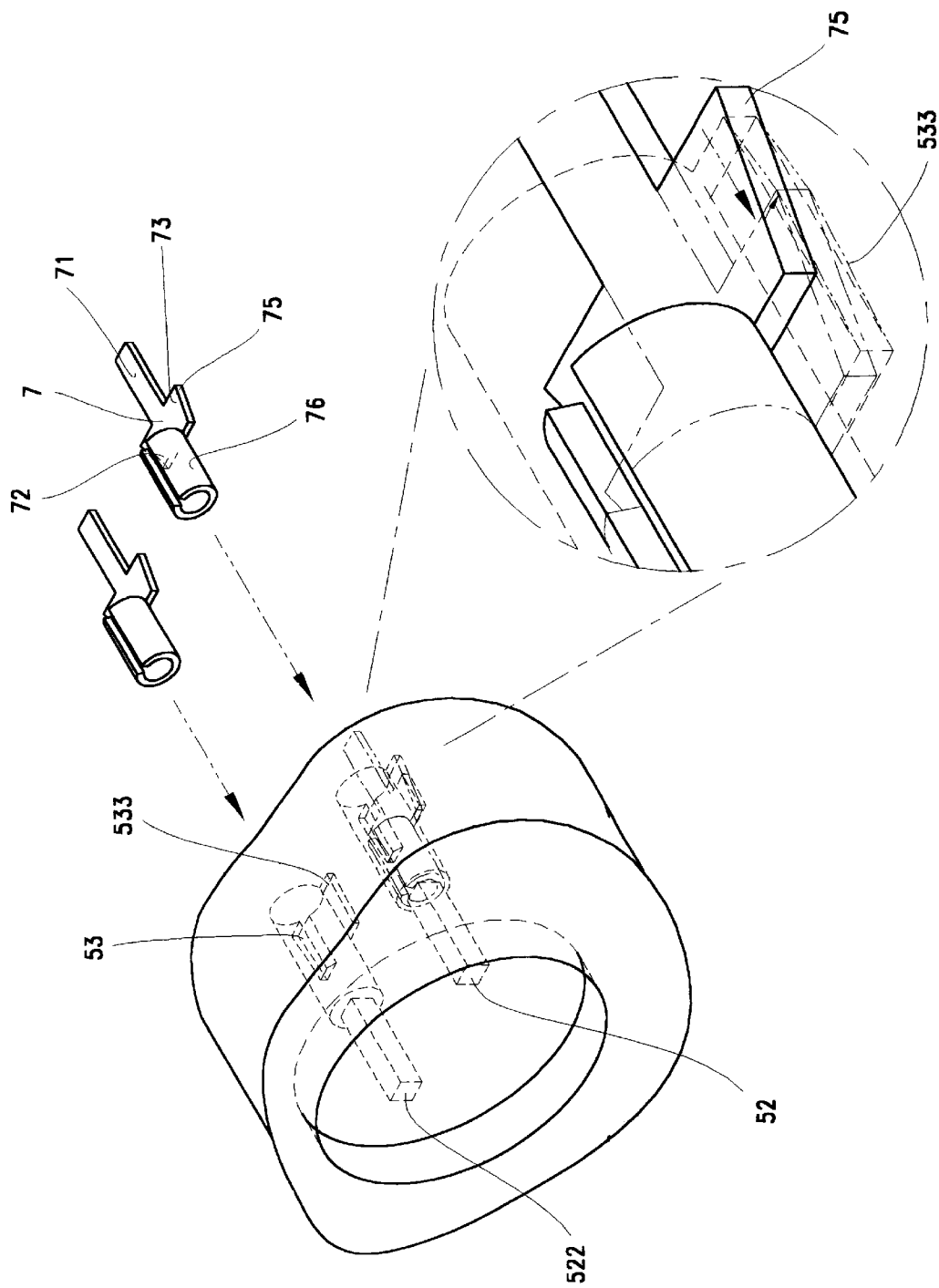
FIG. 4 shows an embodiment of the end pieces of the present invention.
Figure 5:
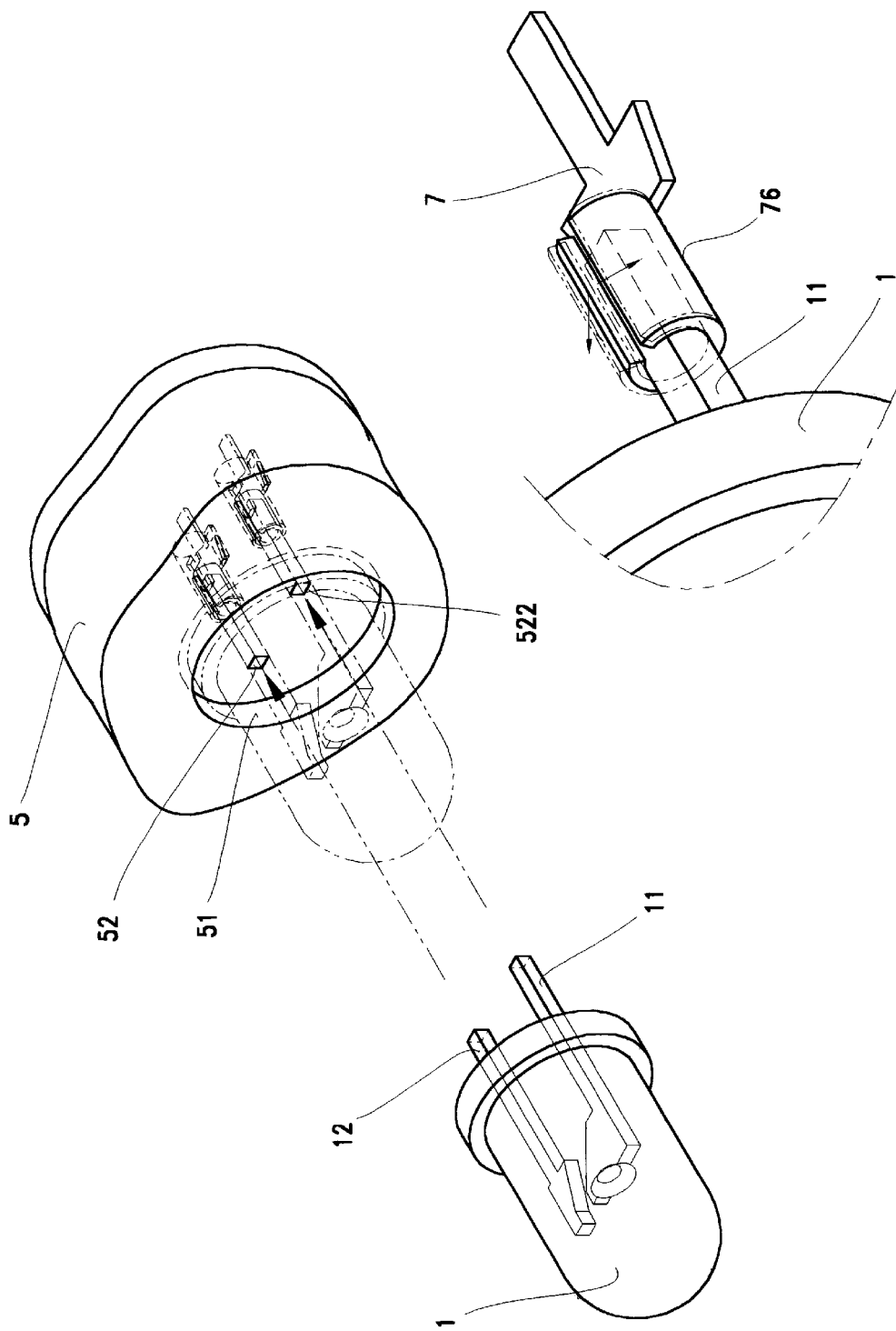
FIG. 5 shows an embodiment of the end piece, which serves to clamp pins of the present invention.
Figure 6:
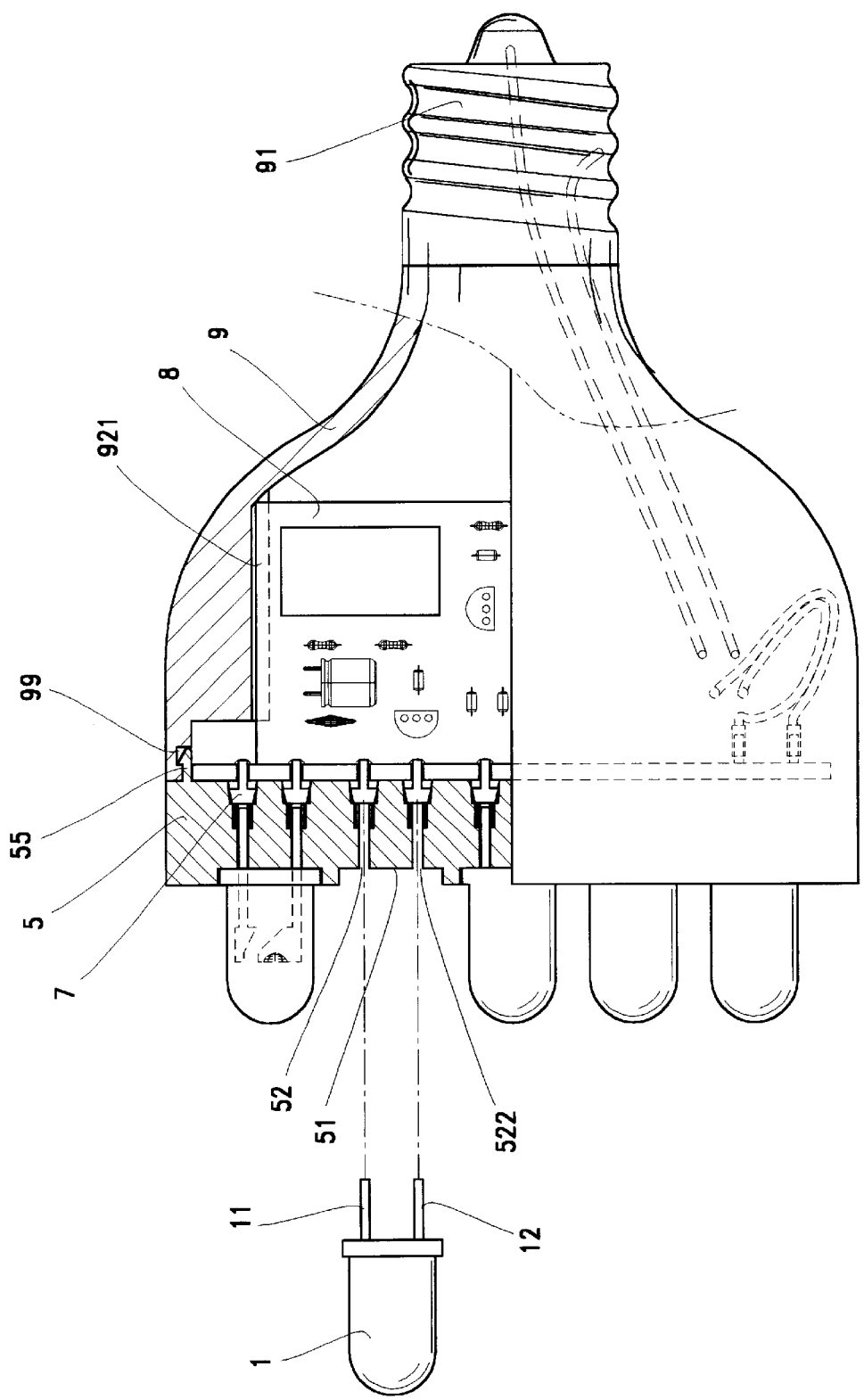
FIG. 6 is a schematic cross sectional view of the present invention.
Figure 7:
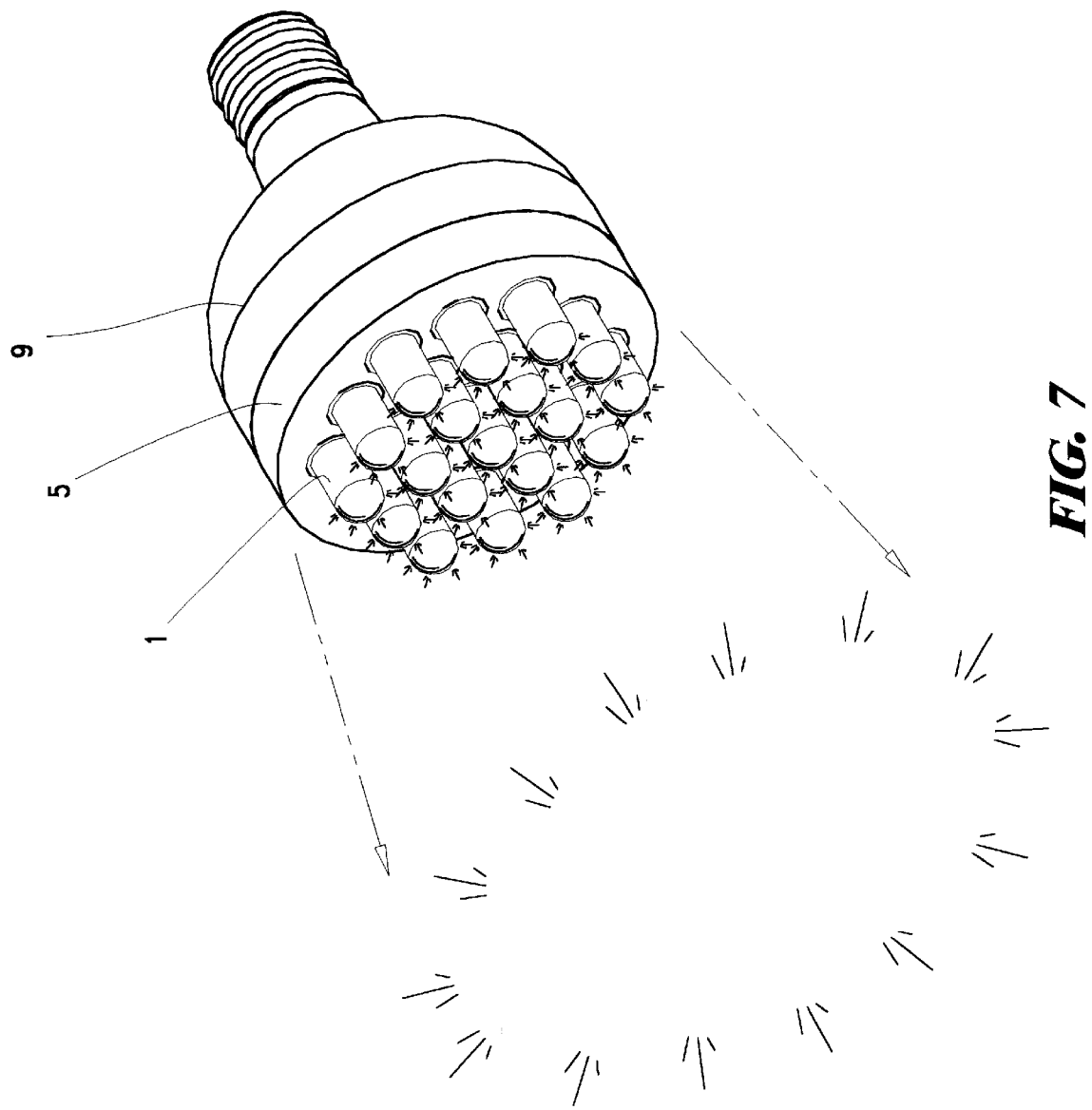
FIG. 7 shows a contrast of the present invention with the prior art bubbles.

With reference to FIGS. 1 to 7, the power saving environment protection bulb of the present invention is illustrated. The power saving environment protection bulb has the following components. A cover disk 5 has a plurality of ring portions 51 formed therein. Each ring portions have two holes 52 and 522, which are penetrated to the lower side of the cover disk 5. At the lower sides of the holes 52 and 522 near the bottom of the cover disk 5 are installed with tapered tracks 53 and 533. The edges of the bottom of the cover disk 5 are installed with tenons 5 which are spaced with an equal distance.

A circuit disk 6 has holes 61, 62 for positive and negative electrodes. One side of the disk 6 has D. C. pins 63 and 633 for being connected to the inserting tubes of a transformer plate.

A plurality of end pieces 7 each has a longitudinal inserting portion 71 at a lower side thereof The middle section of the end piece 7 has two lateral plates 72 and 73 arranged continuously. Each plate has a protrusion 75 for plugging and sealing the lower taper groove (not shown) below the cover disk 5. Upper ends of the plates 72 and 73 are formed with a sleeve 76, which is conformable to the hole 52, 522 of the cover disk 5.

A transformer plate 8 having one side installed with two inserting tubes 81 and 82. An upper and a lower side of the plates are installed with resistors, capacitors for adjusting current; transformer assembling elements.

A lamp seat is a plastic casing. The casing of the seat is combined with a copper cap 91. The inner side of the casing is formed with buckling grooves 99 which are arranged with equal space. Two fixing frames 92 and 93 are placed in the casing so that the slots 921 and 931 may be used to assembly the transformer plate 8, the cover disk 5, the lamp seat, the end pieces 7, the circuit disk 6.

When the end pieces 7 are implanted into the holes of the key plate so as to form with a longitudinal surface with positive and negative currents being arranged alternatively. By the lower edges of the protrusions 75 of the two lateral plates of the end pieces are aligned to the tapered track, and then the cover disk 5 are embedded there into so as to tightly combined with the key plate. The sleeve of the end piece is exactly aligned to the holes of the track and then penetrates through the end cover so that the vertical surface of the transformer plate is combined to the buckling grooves of the two fixing frames. Then, the tenons are engaged to the slots in the frame to be formed as an integral body. Then, a diode I is inserted into the positive and negative pins 11 and 12 to be embedded with the end pieces and then combined with the key plate and transformer plate so as to present a preferred conductive effect. The taper groove is used to retained a buffer space so as to cancel the force under the embed seat of the diode, and thus the sleeve steadily clamps the fixing pins.

It will also be appreciated that other modifications and variations may be made to the embodiments as described and illustrated within the scope of the present application as defined in the following claims.

I claim:

1. A power saving environment protection bulb comprising:

a cover disk having a plurality of ring portions formed therein; each ring portions having two holes which are penetrated to a lower side of the cover disk; at a lower side of the holes near the bottom of the cover disk being installed with tapered tracks; edges of the bottom of the cover disk being installed with tenons which are spaced with an equal distance;

a circuit disk having holes for positive and negative electrodes; one side of the disk having pins of direct current for being connected to the inserting tubes of a transformer plate;

a plurality of end pieces each having a longitudinal inserting portion at a lower side thereof; a middle section of the end piece having two lateral plates arranged continuously; each plate having a protrusion for sealing a taper groove on the cover disk, upper ends of the plates being formed with a sleeve which is conformable to the hole of the cover disk;

a transformer plate having one side installed with two inserting tubes; an upper and a lower side of the plates are installed with resistors, capacitors for adjusting current; transformer assembling elements;

a lamp seat being a plastic casing; a casing of the seat being combined with a copper cap; an inner side of the casing being formed with buckling grooves; which are arranged with equal space; two fixing frames being placed in the casing so that the slots being used to assembly the transformer plate, the cover disk, the lamp seat, the end pieces, the circuit disk.

2. The power saving environment protection bulb as claimed in claim 1, wherein a middle section of the end piece having two lateral plates arranged continuously; each plate having a protrusion for plugging and sealing the lower taper groove below the cover disk.

3. The power saving environment protection bulb as claimed in claim 2, wherein the taper groove is used to retained a buffer space so as to cancel the force under the embed seat of a diode, and thus the sleeve steadily clamps the fixing pins.

* * * * *